United States Patent [19]

Stern et al.

[11] 4,313,178
[45] Jan. 26, 1982

[54] ANALOG SOLID STATE MEMORY

[75] Inventors: Ernest R. Stern, Concord; Richard W. Ralston, Bedford, both of Mass.

[73] Assignee: Massachusetts Institute of Technology, Cambridge, Mass.

[21] Appl. No.: 80,099

[22] Filed: Sep. 28, 1979

[51] Int. Cl.³ .............................................. G11C 11/40
[52] U.S. Cl. ...................................... 365/183; 365/45; 365/157; 365/182; 365/184
[58] Field of Search ................. 365/45, 157, 182, 183, 365/184; 357/24

[56] References Cited

U.S. PATENT DOCUMENTS 4,070,652  1/1978  Heng et al. ......................... 365/157
4,101,965  7/1978  Ingebrigtsen et al. ............... 365/157

Primary Examiner—Terrell W. Fears
Attorney, Agent, or Firm—Robert F. O'Connell

[57] ABSTRACT

A solid state device capable of providing long-term storage of analog signals which in a particular embodiment utilizes a plurality of MNOS storage elements. An input analog signal is applied to a plurality of temporary storage means each associated with an MNOS storage element for temporarily storing a charge proportional to the amplitude of the portion of the input analog signal applied thereto. Storage control means are used to transfer the temporarily stored charges to the long-term MNOS storage elements so that controlled amounts of carrier charges are stored in the nitride layers thereof, such controlled amounts being substantially linearly proportional to the temporarily stored charges associated therewith. In a particular embodiment the input analog signal may be supplied via a surface acoustic wave (SAW) device and coupled to the MNOS device directly or it may be coupled to a charge-coupled device (CCD) and then coupled to the MNOS device.

14 Claims, 21 Drawing Figures

ANALOG SOLID STATE MEMORY

The Government has rights in this invention pursuant to Contract Number AF19(628)-78-C-0002 awarded by the U.S. Department of the Air force.

INTRODUCTION

This invention relates generally to signal storage devices for storing analog signals and, more particularly, to analog signal storage devices which use essentially completely solid state techniques.

BACKGROUND OF THE INVENTION

Analog signals are often stored in permanent form on magnetic tapes or disks which require the use of relatively cumbersome mechanical drive systems and which have, in many cases, relatively limited bandwidth capabilities. In systems which are intended to store analog signals by utilizing solid state techniques, the analog input signals are normally first converted to digital signals through the use of appropriate analog-to-digital converters, the signals in digital form being thereupon stored in binary solid state memories. In reading out such signals, the binary digital signals are appropriately read by utilizing digital techniques and the binary data is then converted to an analog signal through the use of suitable digital-to-analog conversion techniques. Such a procedure is also relatively cumbersome and in some cases, may be prohibitively expensive unless the process is limited to relatively low frequency input and output signals.

It is desirable to devise a system which will be essentially completely solid state in nature and will be capable of storing analog signals without the need to convert such signals to binary digital form. Such a system would be less cumbersome than the analog signal storage techniques discussed above, since it is capable of being fabricated in a much more compact form and, if made in sufficient quantities, is likely to be less expensive than presently used analog signal storage systems. Such a device should have a substantial commercial market, particularly if it were capable of storing either moderate band-width base-band signals or relatively wide-band RF signals.

In many applications it is desired that the analog signals be suitably processed, such as by obtaining a correlation thereof against a known reference signal or by performing Fourier transforms, and the like. An essential difficulty which is often encountered when implementing the desired signal processing function is that the time scale over which the data collection takes place does not match the time scale over which signal processing can be conveniently implemented in analog devices. Accordingly, such systems often must resort to digital techniques in order to achieve the storage function.

The development of a wide-band solid state analog storage system, however, would overcome the need for digital storage by providing a simple compact device for storing a collection of analog data so that it can be so processed. Such a memory would find a wide range of applications in many electronics, radar and communication systems, for example.

DESCRIPTION OF THE PRIOR ART

Much technological effort has been expended over the past few years in the development of solid state MNOS (metal-nitride-oxide-silicon) structures for the storage of digital data signals. The use of MNOS devices is advantageous since it permits such binary data to be retained for relatively long periods of time (anywhere from a few hours to many weeks, for example) depending on the material parameters which are used. Moreover, such storage is non-volatile in nature and no power need be applied to retain the digital data which has been stored. Moreover, readout of the data is non-destructive in nature and the data may be read out many times without affecting its storage characteristics. Despite the desirable characteristics of MNOS materials for binary digital storage, however, up to now no one has devised effective techniques, or structures, for permitting the storage of analog signals in MNOS materials.

For example, U.S. Pat. No. 3,648,258 issued to F. A. Sewell on Mar. 7, 1972 discloses the use of a MNOS transistor structure used as an optical memory circuit for digital signals only. Sewell makes no mention of the need for linearity of operation. Although a brief mention is made of a desire to provide operation in which the intensity of light would be made to vary in accordance with the signal to be stored, Sewell does not disclose any device which could be made to operate in a linear fashion for such purpose.

The patents of D. R. Lampe et al., U.S. Pat. No. 4,034,199, issued on July 5, 1977 and Y. T. Chan, U.S. Pat. No. 3,995,260, issued on Nov. 30, 1976, disclose specific embodiments in which charge-coupled-devices (CCDs) are coupled to MNOS structures. Lampe, et al. describe a MNOS transistor memory device at each CCD tap with the MNOS serving as a tap weight multiplier by its conductance characteristic, the device being prepared for use in a fairly specific application as a programmable analog transversal filter. Chan proposes a memory device for digital storage. While Chan makes passing reference to a desire for analog operation to the extent of the ability of the system to store partial packets of charge and its ability to distinguish the size of the partial packet during readout, he discloses no structure for such purpose. In short, neither Lampe et al. nor Chan demonstrate or teach a method of achieving linearity in the memory element, such linearity being essential to operation of an analog device.

Devices and techniques utilizing surface acoustic wave techniques have been suggested for the storage of analog signals such devices being described, for example, in U.S. Pat. Nos. 4,016,412 issued on July 5, 1977 to Stern et al.; 4,066,984 issued on Jan. 3, 1978 to Stern et al.; and 4,101,965 issued on July 18, 1978 to Ingebrigtsen et al.

While such techniques have permitted the storage of analog signals, the storage times have been relatively short and the analog information cannot be retained for a sufficiently long time to permit the information to be utilized in many data processing applications.

Other techniques suggested for storing analog information include charge-coupled devices wherein the CCD storage electrodes are loaded with sampled analog information supplied thereto either serially or in parallel, the CCD device being comparable in operation to a shift register. Again, such devices are unable to store such information for sufficiently long periods of time to permit desired data processing thereof in many applications.

BRIEF SUMMARY OF THE INVENTION

This invention provides for the storage of analog signal information utilizing dual-dielectric solid state devices, such as devices using MNOS solid state materials and techniques in which the structural configuration thereof is arranged and operated so that a measured amount of charges, preferably minority carrier charges, are entered into the depletion wells of a MNOS structure, such charges being thereupon subsequently committed to long-term storage in the silicon nitride layer thereof. In accordance therewith the amount of minority carrier charges and, hence, the amount of stored charge, is selectively controlled so as to be proportional to an input analog signal so that the stored charge effectively represents the analog input signal. The selective control of minority carrier charges is achieved through suitable control of the inversion charge within the MNOS device and permits the device to accurately store analog signal information as opposed to storing merely binary digital information as in prior art MNOS storage devices.

DESCRIPTION OF THE INVENTION

The invention can be described in more detail with the help of the accompanying drawings wherein:

FIG. 1 describes the process of charging a MNOS device with majority carrier charges;

Figure 4:
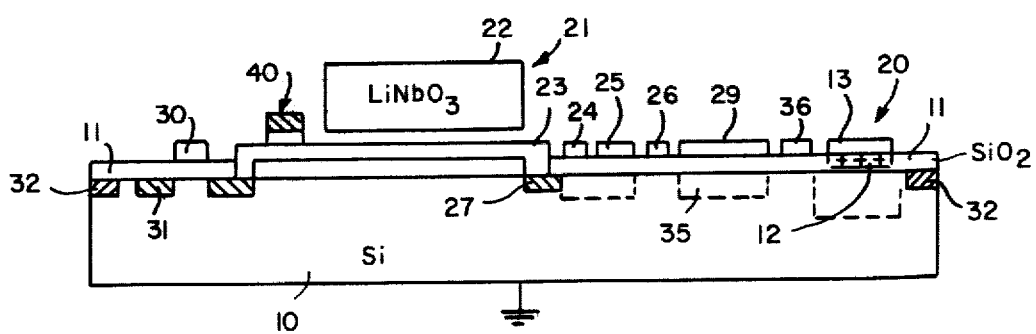
FIG. 4 shows a diagrammatic view in section of a structure of a MNOS device of the invention utilizing a SAW/CCD signal input system.
Figure 5:
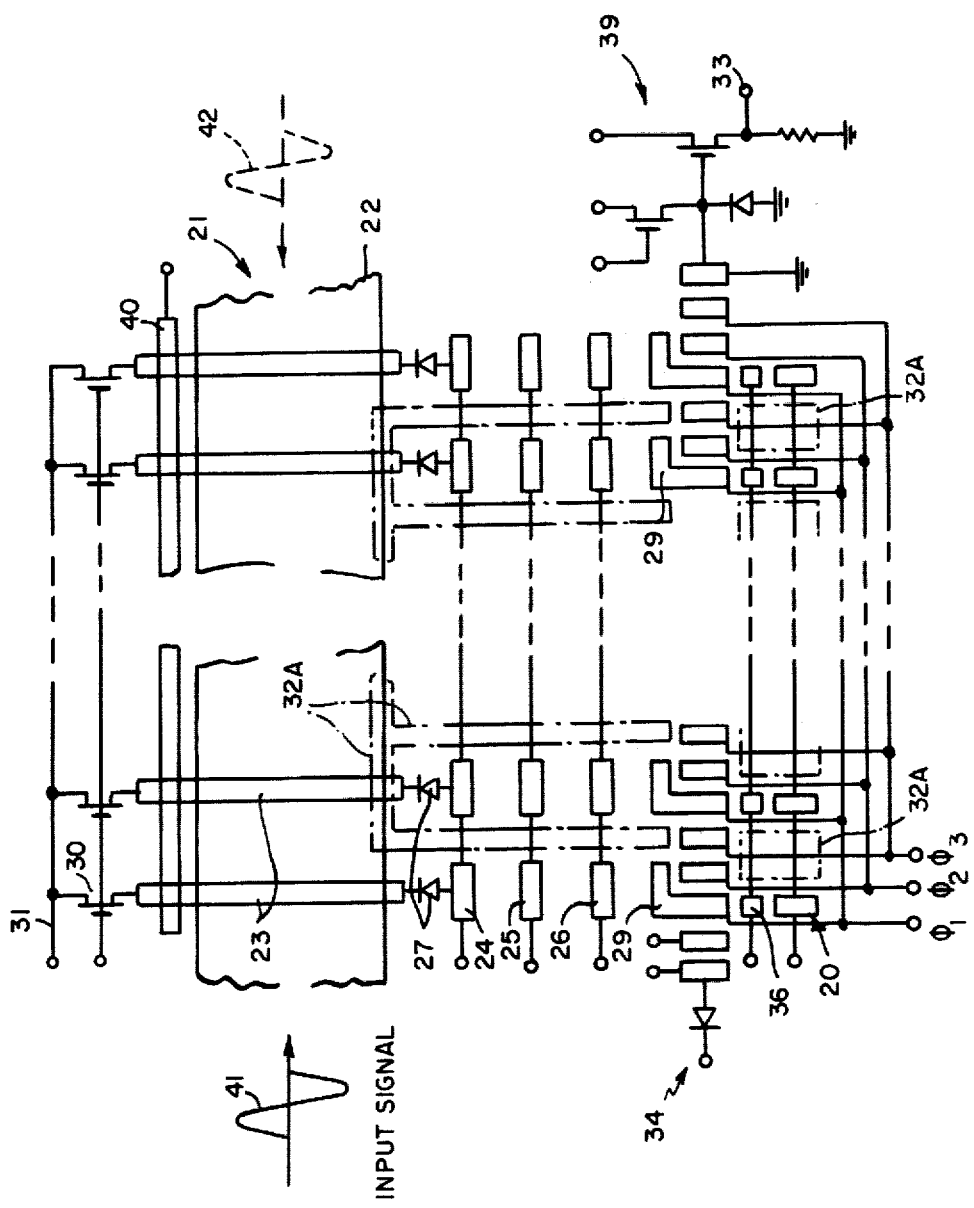
Figure 6:
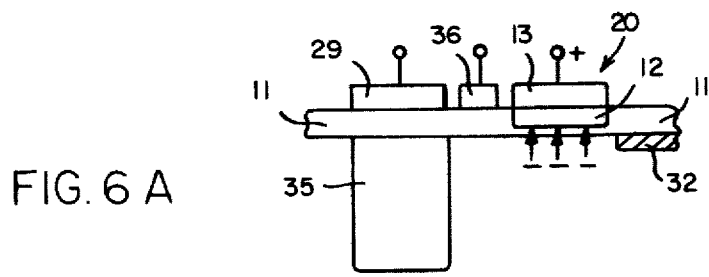
Figure 6:
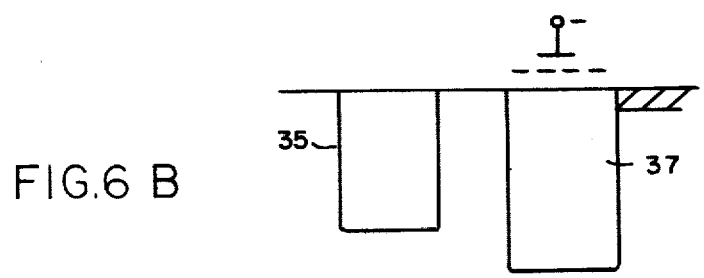
Figure 6:
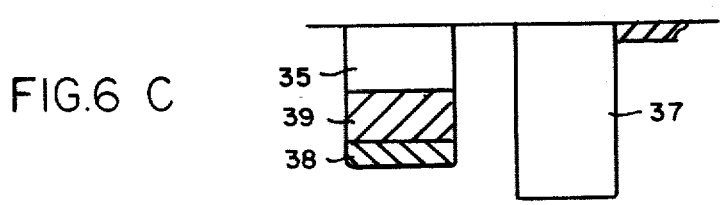
Figure 6:
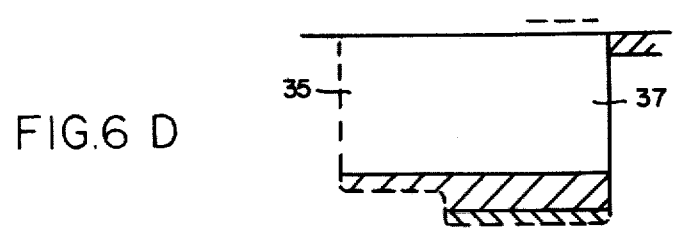
Figure 6:
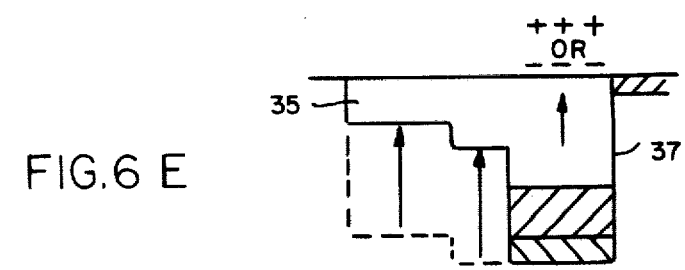
Figure 6:
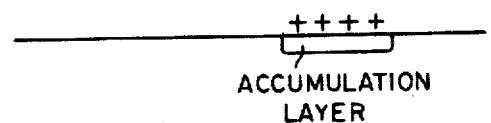
Figure 6:
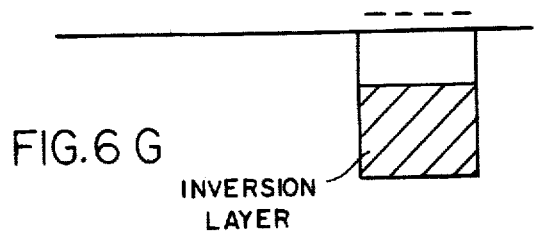
Figure 6:
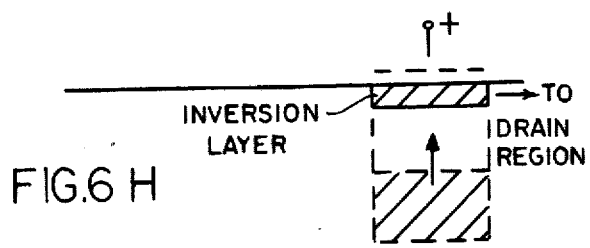
Figure 6:
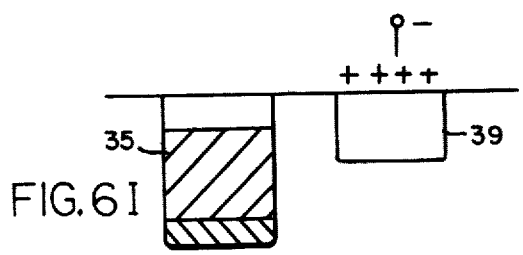
Figure 6:
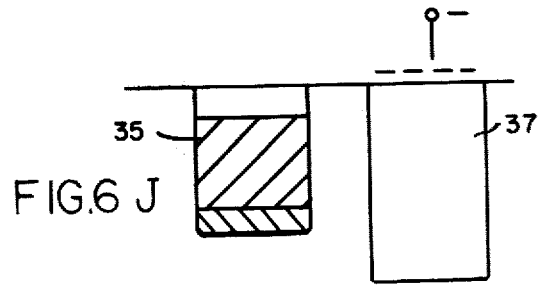
Figure 6:
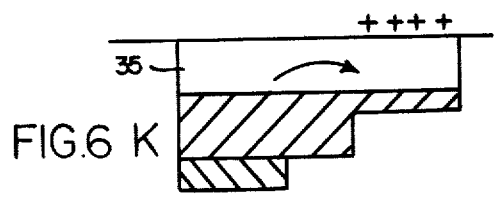
Figure 6:
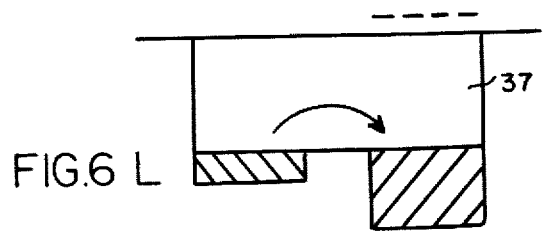
Figure 6:
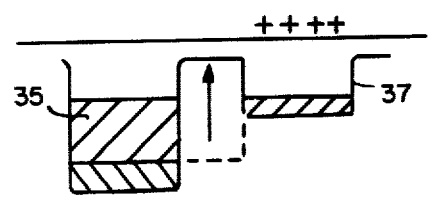
Figure 6:
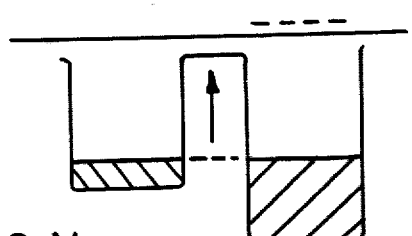
Figure 7:
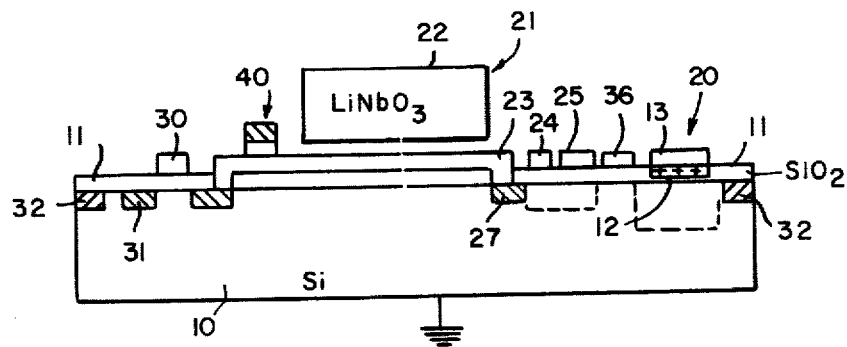
Figure 8:
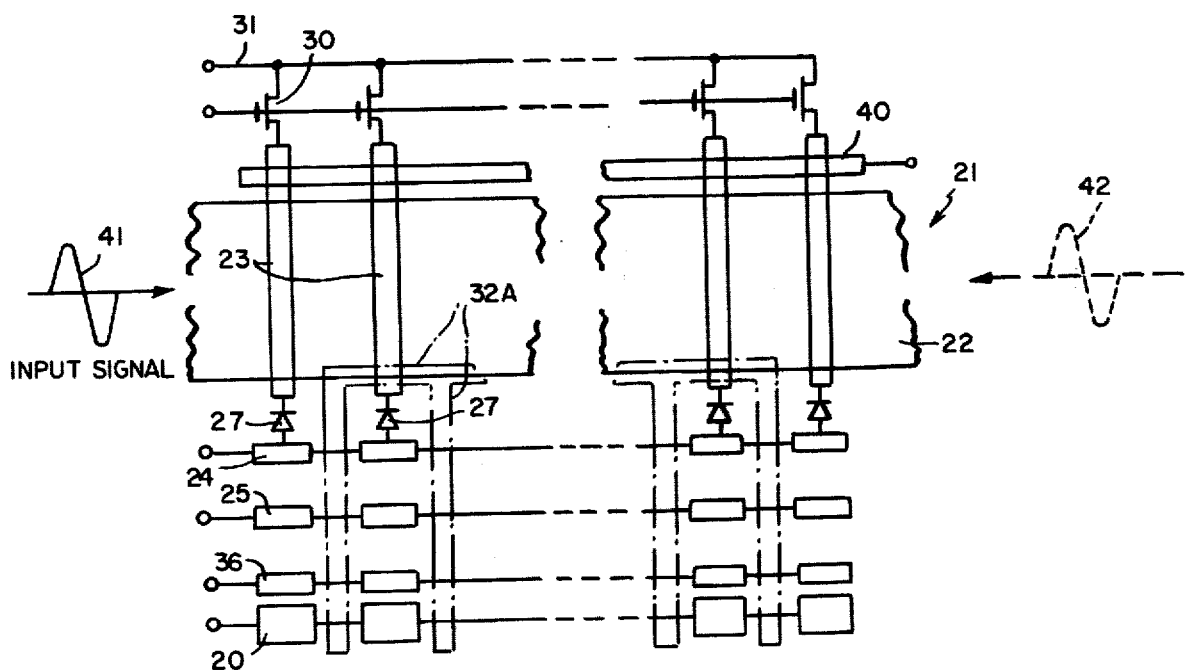

FIG. 5 discloses a plan view in diagrammatic form of the device of FIG. 4;

FIG. 6(A) through FIG. 6(N) depict in diagrammatic form the sequence of operation for the storage of analog information in the MNOS device of the invention; and FIGS. 7 and 8 show a diagrammatic view in section and a plan view of a MNOS device of the invention utilizing a SAW signal input system.

Figure 1:
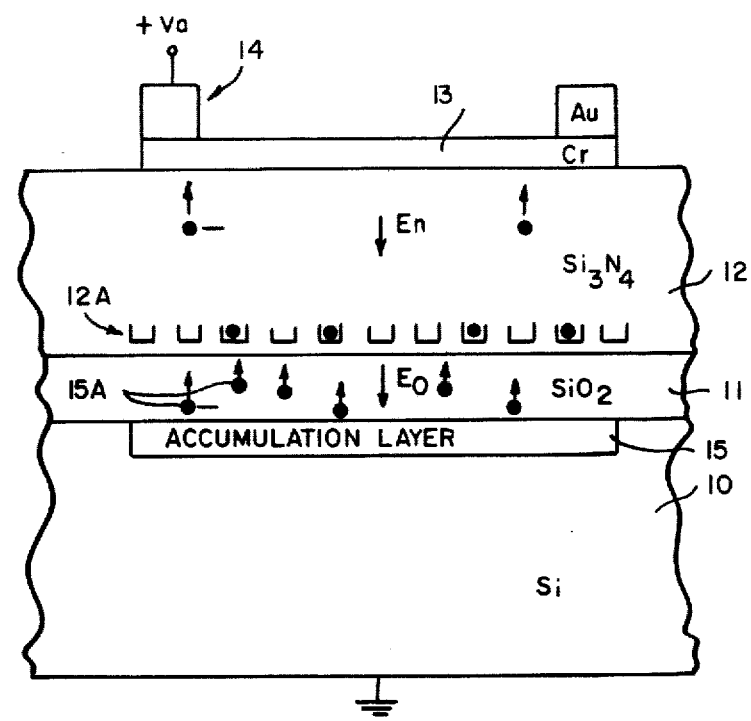

A MNOS device of the type which can be utilized in the invention, as seen in FIG. 1, comprises a semiconductor substrate, e.g., silicon substrate 10 of low n-type doping having a relatively thin (30 to 50 Å) thermally grown silicon dioxide layer 11 on one surface thereof, and a chemically vapor-deposited silicon-nitride layer 12 which is deposited on layer 11 and which has a relatively larger thickness of about 500 Å, for example. The techniques for fabricating such device are known to those in the art.

A metal gate electrode 13, which in a particular embodiment may be formed of a relatively thin layer of chromium, for example, is positioned on the exposed surface of silicon-nitride layer 12. The thickness of layer 13 is not critical, although in the initial embodiment discussed below, the layer is made relatively thin so as to be capable of passing light rays as described in the experimental embodiment discussed below which demonstrates the operation of the invention. An appropriate terminal 14 for applying voltage thereto is connected to chromium gate 13, the voltage being applied between such point and the grounded ohmic contact on the back surface of substrate 10.

FIG. 1 is helpful in explaining how such a device can be charged with majority carriers (electrons). The application of a positive bias voltage of sufficient level to terminal 14, and hence to gate 13, serves to accumulate majority carriers at the interface between silicon oxide layer 11 and the silicon substrate 10 as shown by the accumulation layer 15. There is relatively little potential drop across the silicon substrate itself. For relatively moderate gate voltages (e.g., in the order of about 20 volts) there exists a sufficiently intense field ($E_0$) in the silicon oxide layer 11 to cause tunneling of the majority carries 15A through the oxide layer into the nitride layer. Since the latter is an amorphous layer, grown with relatively low conductivity, such nitride layer serves to block tunnelling of most of the electron flow, or current, at the field $E_n$, therethrough and, accordingly, the electrons are captured near the surface of the oxide/nitride interface by the high density of traps 12A which exist in the nitride near the interface surface thereof. A more complete description of the precise nature of such tunneling, current and trap charge process can be found in many articles known to those familiar with the art.

An essentially unlimited number of accumulation layer electrons are available to fill the nitride traps and, accordingly, the charging process can proceed to saturation. As used herein the term saturation means that the traps are filled with carriers until the opposing field, which is induced by the trapped carriers suppresses the tunnelling operation so that the charging and discharging rates reach an equilibrium and no further net increase in trapped charge occurs (although empty traps may be available). If the applied voltage at terminal 14 is removed, the remnant fields in the nitride layer and in the oxide layer are well below thresholds for high conduction and, hence, the electrons can escape the traps only very slowly so that the charge sheet (i.e., the charges in the traps) can be retained for a relatively long period of time, there being no power needed to be applied to maintain such storage. The presence of such trap charges is reflected in a shift in the surface potential of the underlying silicon so that the negative trap charges produce a positive offset in the majority conduction threshold for the silicon. The magnitude of such threshold shift can be sensed by appropriate capacitive techniques so that a readout of the saturated charge can be performed. Such technique has been used in digital storge devices for providing fully charged traps representing one state of a binary store.

Figure 2:
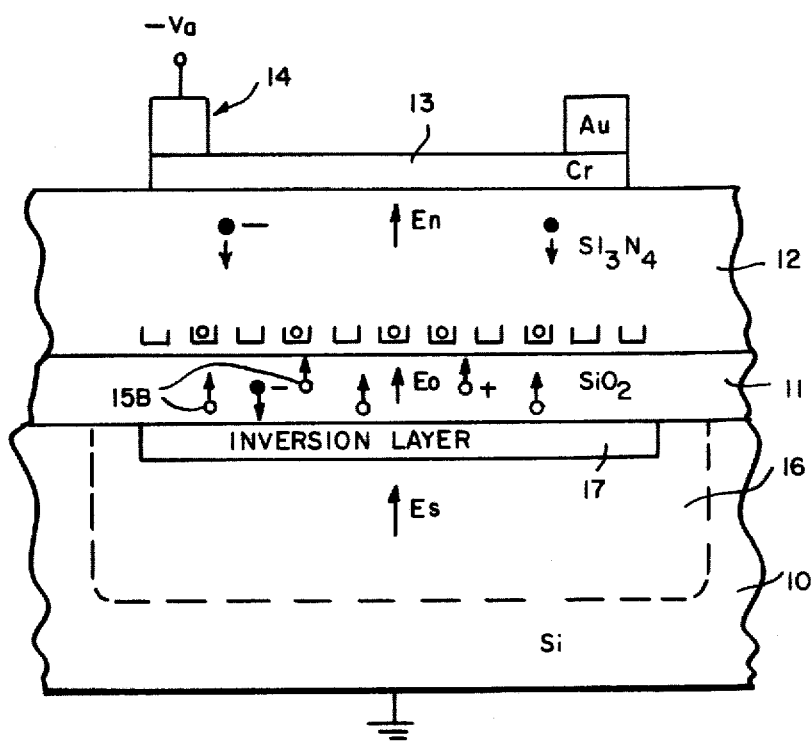
FIG. 2 shows the process of charging a MNOS device with minority carrier charges.

FIG. 2 discloses the process involved in charging with minority carriers 15B (holes) for the example described in which a negative bias voltage is applied to terminal 14, and, hence, gate 13. A substantial fraction of the applied negative gate voltage occurs across a depletion layer 16 (as shown by field $E_S$) within the silicon substrate 10 thereby making necessary the use of relatively higher gate voltages (e.g. in the order of about 30 volts) in order to initiate tunneling of minority carriers from an avalanche-generated inversion layer of holes (rather than an accumulation layer of electrons as in FIG. 1) for use in prior art digital memory structures. The voltage required depends on the doping density used. For digital memories the art has generally taught the use of relatively high doping and the use of relatively lower voltages.

The inversion layer 17 provides a relatively unlimited source for charging the traps in nitride layer 12 and such traps, in accordance with previously used techniques, can be written to saturation. In this case, if the traps have been previously charged with electrons, the holes, for example, can neutralize some or most, but not all, of the initially stored electrons (the storage of which is discussed with reference to FIG. 1), thereby leaving a net negative charge in a first uncontrolled equilibrium condition, or the holes, for example, can neutralize all of the initially stored electrons and provide an excess of trapped minority carriers so as to charge the traps positively to leave a net positive charge in a second uncontrolled equilibrium condition. The resultant negative threshold shift, whether to the first or second equilibrium condition, comparable to the positive threshold shift discussed above, has been used in digital memories as the other binary state. Although a variety of schemes for such digital storage are known to those familiar with the art, (See, for example, J. I. Raffel et al., "Storage Experiments With Ultra-High Density MNOS Capacitors", Proc. IEEE, 1629 (Nov. 1976)), no one as yet has suggested any viable, or practical, way of using such processes for storing analog information.

In accordance with the invention, however, such structure can be adapted, as discussed in more detail below, for use in providing analog storage if, after fully charging the traps to saturation with electrons, the amount of minority carrier charges (holes for the particular example described) which are entered into the depletion well and then committed to storage is suitably controlled so that the "writing" or storage of such charges other than to saturation in the traps is possible. Moreover, if the amount of stored charges is controlled to be proportional to an analog input signal through suitable control of the inversion layer charges, such device can be used to store a replica of such analog signal. An appropriate experimental technique to demonstrate such analog storage operation can be described with reference to MNOS devices of the type described in FIGS. 1 and 2.

As discussed with reference to FIG. 1, a positive gate voltage can be first applied to terminal 14 (as in FIG. 1) so as to reset the memory traps so as to charge them fully (i.e. to saturation) with electrons (majority carriers) thereby providing a large electron occupation of such traps in the nitride layer 12. A comparable negative gate voltage is then applied so as to provide for a relatively deep depletion layer 16 within the silicon substrate (as in FIG. 2) without avalanche generation of minority carriers. When such device, for experimental purposes to demonstrate the desired operation, is maintained in darkness, the thermal generation of minority carriers (holes) occurs relatively slowly so that full inversion does not occur for some time. For short times, therefore, an insufficient number of holes and an insufficient oxide field ($E_0$) are present for any appreciable tunneling to occur.

Into the effectively empty deep-depleted well 16 a controlled amount of light flux can be injected by illuminating, for example, the semi-transparent chromium gate 13 with an array of light emitting diodes (LED). The photon flux which is absorbed in the depletion layer generates electron/hole pairs and the depletion field sweeps the electrons into the neutral bulk while the holes are swept to the oxide/silicon substrate interface to form an inversion layer 17. The formation of an inversion layer causes a collapse in the depletion field so that a redistribution of the applied voltage occurs and a sufficient voltage becomes available to promote a significant tunneling field in the oxide. Accordingly, holes from the controlled inversion layer (controlled in the sense that the number of holes which tunnel through to the nitride layer depends on the amount of light flux with which the device has been illuminated) are able to occupy the nitride traps. Such tunneling of minority charges is a strongly self-quenching process so that as the occupation of positive charges in the traps builds up there is a corresponding drop in the inversion layer charge and a decrease in the oxide field. Since the tunneling currents are exponentially dependent on the oxide field, the traps do not charge to saturation.

The controlled change is the net charge which results may be brought about in accordance with several different operations. Thus, the holes may tunnel into the nitride layer and effectively neutralize less than all of the electron charges already present in the traps thereof. In such case, a net negative charge which is less than the original charge results. Alternatively a sufficient number of holes may tunnel into the nitride layer not only to neutralize all of the previously stored electrons but also to occupy previously unfilled traps therein so that a net positive charge results. In a further alternative operation, the holes may tunnel into the nitride layer without neutralizing any of the electrons previously present in the traps so as to occupy the unfilled traps therein so that a reduced overall net negative charge or a net overall positive charge results. As a still further alternative the holes in the silicon inversion layer may cause a reverse-tunneling of the previously stored electrons from the nitride traps through the oxide layer into the silicon so that the total number of electrons in the nitride traps is reduced and a reduced net negative charge results.

In all of the above cases, or combinations of the operations thereof, a controlled net change in the original charges in the nitride traps occurs. This net change in trap charge has been found over a relatively wide magnitude to be substantially linearly proportional to the injected inversion charge (which is in turn proportional to the illumination) and, hence, the device has effectively stored the analog information represented by the light flux with which it has been illuminated.

Figure 3:
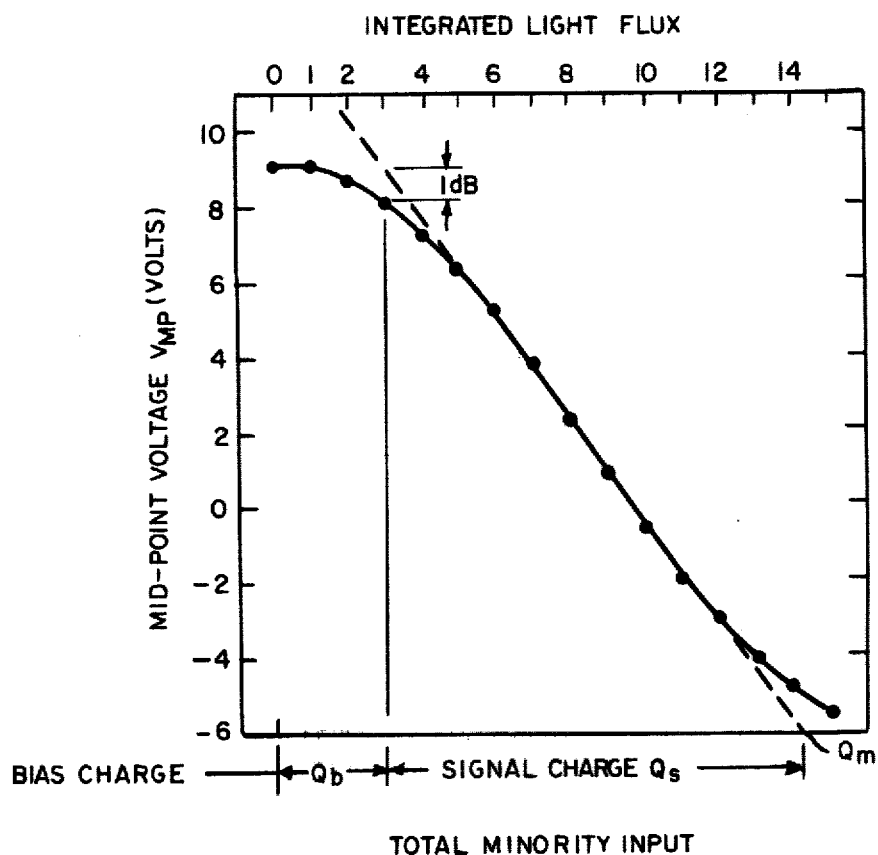
FIG. 3 shows the relationship between the signal charge and the mid-point voltage in a MNOS device of the type depicted in FIGS. 1 and 2.

An experiment utilizing the above technique has shown that the characteristic of the readout voltage as a function of the signal charge (or integrated light flux) is essentially linear as depicted in FIG. 3. Thus, for a typical MNOS device, over a voltage swing of nearly 13 volts the stored charge can be essentially a linear (to within approximately 1 dB) replica of an input signal, relatively large quantities ($Q_s$ at least about 1.5 to $2 \times 10^{-6}$ coulombs/cm$^2$ or more) of charge being capable of storage in a linear, analog fashion.

Accordingly, the curve of FIG. 3 demonstrates the linear storage operation of the MNOS device which can occur as a result of an input signal in which a controlled amount of the inversion layer charge can be provided.

With the above description of a controlled charge technique for use with MNOS structures of the type shown in FIGS. 1 and 2, an overall analog memory system can now be described with reference to FIGS. 4 and 5 which shown MNOS storage cells 20 utilized in conjunction with a suitable surface acoustic wave/charge coupled device (SAW/CCD) for providing an input signal to be stored and for reading out such stored signal to provide an output signal.

The SAW/CCD structure is substantially similar to that described in the article "An Acoustoelectric SAW/CCD Device", D. L. Smythe et al., 1978 Ultrasonics Symposium Proceedings, Paper F-2, IEEE Cat. #78CHI344-ISU. An improved embodiment of such a structure is also disclosed in the co-pending application of Smythe et al. entitled "Solid State Devices Combining the Use of Surface Acoustic Wave Devices and Charge-Coupled Devices", filed concurrently herewith. Such a structure need not be discussed in detail here, other than to point out that, in such a system, a SAW device 21 is capable of accepting a wide band input signal 41 supplied from a suitable transducer (not shown) to produce a traveling acoustic wave signal which travels along the surface of a lithium niobate substrate 22. A relatively large plurality of sampling fingers 23 (e.g., 300 fingers) are used to pick up sampled values of the input signal at a suitable instant in time, which sampled values of the signal are thereupon transferred to a plurality of corresponding temporary storage wells 35 under the electrodes 29 of a CCD device. Appropriate signal gates, sampling gates 24, storage gates 25 and transfer gates 26 are utilized for such purpose and described in the above-referenced article. In the particular embodiment shown here, the signal gates shown in the article are replaced by coupling diodes 27 effectively formed at one end of each of sampling fingers 23, which fingers contact a region of p-type silicon formed at the surface of an n-type silicon substrate 10, for example. In addition, the CCD register has three phases designated as $\phi_1$, $\phi_2$, and $\phi_3$.

The bias gates 30 are actuated to produce a bias voltage thereacross from a bias voltage source applied from bias bus 31 to ground, thus prebiasing the plurality of fingers for optimum interaction with a surface acoustic wave. This prebiasing also admits prebias charge (approximately one-half the full well capacity) to the wells under electrodes 24 and 25. The input signal (electric fields accompanying the SAW signal) is picked up by the sampling fingers 23 and the charge level under gates 24 and 25 is modulated by the signal. Shutting gate 24 holds a replica of the signal under gate 25. Suitable channel stop regions 32 are formed at the surface of the bulk silicon substrate 28 on which the CCD electrodes 29 and MNOS cells 20 are formed, in order to isolate adjacent signal samples. Moreover, additional channel stop regions 32A are formed between each set of gates, and wells, as shown in FIG. 5 to isolate the members of the overall array from each other.

As can be seen in FIG. 5, the linear array of sampling fingers 23 and the corresponding gates and CCD $\phi_1$ wells 35 provide effective temporary storage in the $\phi_1$ wells. A more detailed discussion of techniques for doing so is disclosed in the above mentioned Smythe et al. copending application, for example, which discusses the use of a two-phase register in an n-channel device. Similar techniques can be used for the three-phase, p-channel device disclosed herein.

The CCD device operates, in effect, as a parallel-loaded shift register, it being known to those in the art that the signals stored herein can be retrieved in a serial shift fashion at the output terminal 33 via output circuit 39 thereof. As is also known to those in the art a more modest bandwidth signal input can be directly applied to the CCD shift register via the input circuit 34, such signal being suitably clocked into the shift register in serial fashion. The operation of the structure of FIGS. 4 and 5 can be best understood with the help of the diagrammatic sequence of drawings shown in FIGS. 6(A)-6(N). The sequence shown therein represents the operation of one of the array of CCD $\phi_1$ wells 35 in conjunction with the operation of corresponding ones of the transfer gates 36 and MNOS storage cells 20, the remaining corresponding elements of the overall array operating in a similar manner. The conducting electrodes 13 need not be transparent nor made of chromium in this embodiment.

In the initial step, as shown in FIG. 6(A), the CCD $\phi_1$ wells 35 are effectively emptied of charge and the transfer gates 36 are held high to isolate the MNOS storage wells from the CCD $\phi_1$ wells. The MNOS cells are then biased sufficiently strongly, in this case positively, for example, for an n-type bulk silicon substrate, to commit a large negative charge sheet to the nitride/oxide interface thereof and, in effect, to reset the storage system as discussed above, with respect to FIG. 1.

During the subsequent storage operation a depletion (or "write") voltage is applied to the MNOS storage cell to form an MNOS storage (depletion) well 37 which is, in effect, deeper than the CCD $\phi_1$ well 35, as shown in FIG. 6(B). In this case the depletion voltage is sufficiently negative to provide such depletion well formation, the size of the voltage, in effect, determining the depth thereof. As seen in FIG. 6(B) the transfer gate 36 still remains high. With the transfer gate 36 remaining high, the sampled analog signal charge 39 which is picked up by the sampling finger of the SAW device is transferred into the CCD $\phi_1$ well 35 and is temporarily held there once the CCD transferring process is stopped. This analog charge is superimposed on a bias charge 38 the level of which is determined both by the level of prebias charge admitted to the wells under gates 24 and 25 and subsequently transferred to well 35 and by the additional bias charge residing in well 35 prior to transfer. This additional bias charge is supplied to the CCD $\phi_1$ well at its input circuit 34 and clocked into the CCD. The $\phi_1$, $\phi_2$, and $\phi_3$ clocks are then stopped while transfer of the signal charge occurs. The net bias charge 38 is effectively superimposed on the input signal charge so that the total charge which is temporarily stored in the $\phi_1$ well 35 comprises both the bias charge 38 and the input signal charge 39, as shown in FIG. 6(C) and as discussed with reference to FIG. 3. The purpose of the bias charge $Q_b$ is to place the overall charge within the linear range, indicated in FIG. 3, of the long-term storage system. Thus signal charge $Q_s$ from zero to the maximum $Q_m$ will be stored in analog fashion.

As seen in FIG. 6(D), the MNOS transfer gate 36 is then lowered to a level below the depth of the CCD $\phi_1$ well 35 so that the charge (including the signal charge and the bias charge) is effectively distributed within the CCD well and the MNOS storage well, as shown. The transfer gate region is in a practical device substantially less in volume than either of the well regions shown in the figures, although for clarity the transfer gate is depicted as larger than its dimensions would be in practice.

In FIG. 6(E) the analog signal charge and bias charge are completely transferred to the MNOS storage well by raising the CCD $\phi_1$ voltage (to reduce the CCD well) and raising the transfer gate voltage substantially immediately thereafter so that all of the signal charge and bias charge is transferred to the MNOS storage well.

As described above, in the discussions with respect to FIGS. 1 and 2 the presence of minority charge causes the oxide field to increase and an amount of the total charge proportionate to the input signal charge is thereby committed to long-term memory in the oxide by the tunneling process as discussed above with reference to FIGS. 1 and 2, the stored charges in effect representing an inverted replica of the input signal. At such stage all power to the device can then be shut off and the stored charge will effectively remain for a relatively long period of time as desired. Such a stage with power off is shown in FIGS. 6(F) and 6(G) for two different conditions. Thus, when the power is off, the CCD $\phi_1$ well essentially collapses, and depending on the level of the input signal the storage process either provides a net positive storage charge as shown in FIG. 6(F) or a not negative storage charge as shown in FIG. 6(G). For the positive storage charge condition an accumulation layer (as shown in FIG. 2) is present, while for a negative storage charge condition an inversion layer will be attracted to the storage well as shown in FIG. 6(G). As an optional refinement, in order to minimize decay, the full formation of an inversion layer can be prevented by periodically applying an accumulating voltage to MNOS cell 20 in which case the inversion layer is then collapsed and the holes can be drained, or collected, as shown in FIG. 6(H) by an adjacent charge drain similar to that described in the above-mentioned copending application of Smythe et al. wherein said drain is termed an auxiliary junction (named 38 in FIG. 2 of said copending application).

In order to prepare the storage device for readout for either the net positive charge or the net negative charge conditions of FIGS. 6(F) and 6(H), a full packet of charge is clocked into the CCD $\phi_1$ well (including a sufficient amount equivalent to the bias charge discussed above) as shown in FIGS. 6(I) and 6(J) for the positive charge condition and negative charge condition, respectively. The input of a full packet of charge into the CCD well can be achieved via standard input circuits 34 as shown in FIG. 5, for example, and applying appropriate clock waveforms to CCD electrodes at terminals $\phi_1$, $\phi_2$, and $\phi_3$ as is known to the art. At the same time, depletion wells 37 are formed in the MNOS device by applying an appropriate depletion (or read) bias voltage to the MNOS device. Such depletion condition exists even should an MNOS cell contain the maximum amount of positive signal charge in the memory, as in the FIG. 6(I) condition. Lesser amounts of stored charge (up to the maximum negative stored charge condition) would be reflected as deeper wells under the MNOS cells, as shown in FIG. 6(J). At this point in the sequence, however, all the MNOS wells of whatever depth are empty and all adjacent CCD $\phi_1$ wells are equally filled with charge, the transfer gate 36 being at its highest point for isolation purposes, as shown in FIGS. 6(I) and 6(J), respectively, for the positive charge and negative charge conditions.

With the device so prepared for readout, non-destructive and non-inverting readout of each of the MNOS cells can now be accomplished by the fill and spill techniques known to the art at least as they relate to CCD devices. In accordance therewith the transfer gate is dropped to the level shown as depicted in FIGS. 6(K) and 6(L), respectively (i.e., to a level just above the bias charge level) to permit the equilibration of charge between the CCD $\phi_1$ well and the adjacent MNOS well.

The transfer gate is then raised again to isolate the MNOS and CCD wells. The amount of charge remaining in the CCD well after such operation, as shown in FIGS. 6(M) and 6(N), respectively, is proportional to the charge stored in the nitride and, thus, constitutes the desired reconstruction of the original analog signal, without destroying the controlled charges in the long-term storage elements which represent the inverted replica of the original analog signal.

Clocking of the $\phi_1$, $\phi_2$, and $\phi_3$ wells of the CCD shift register in sequence then can be initiated to produce a serial analog output of the memory contents of the CCD $\phi_1$ wells in accordance with well-known techniques and utilizing standard CCD output circuits 39 as shown in FIG. 5, for example.

If a memory with both wide band input and output signals is desired, the input signal is applied to the SAW device, as discussed above, and the output is obtained on an appropriate output bus 40 positioned adjacent the sampling fingers (see FIGS. 4 and 5) is utilized, in much the same manner as discussed in the above referenced copending application of Smythe et al. By appropriate use of the gates between the SAW device and the CCD device the charge in the CCD $\phi_1$ well can be transferred to provide voltages on the sampling fingers 23 which are then scanned by a second acoustic wave (an impulse) and voltages picked up by output bus 40 form the fast output (wide band) analog signal.

As a further embodiment the SAW-CCD-MNOS device of FIGS. 4 and 5 could be used to provide a slow input (narrow band) signal at the input circuit 34 of the CCD device for storage in the MNOS device and by appropriate subsequent transfer from the CCD $\phi_1$ wells to the sampling fingers, as discussed above, a fast output (wide band) signal can be provided at output bus 40 using an impulse acoustic wave as discussed above to produce a slow-in, fast-out device.

An additional alternative embodiment could utilize the MNOS storage cells 20 solely in conjunction with the CCD device of FIGS. 4 and 5, the SAW device not being used therein. In such an embodiment the transfer gates 26 and all above them in FIG. 5 are not needed, and circuits 34 and 39 would provide the input and output functions respectively. Operation would proceed as described for FIGS. 6(A) through 6(N) to provide slow input (narrow band) and slow output (narrow band) operation.

While the above descriptions are based on the use of a device having an n-type silicon bulk substrate 28, the device is not limited thereto and a p-type silicon can be used with appropriate changes in the regions utilized therein and with appropriate reversals of the polarities of the bias voltages as discussed above. The choice of n-type silicon material may be preferred since it appears likely to aid in the achievement of array uniformity to reduce the fixed pattern noise which is typically introduced in CCD devices having the series-parallel-series configuration as shown. The use of transmutation phosphorous-doped substrates tends to minimize such fixed pattern noise and to allow the fabrication of relatively uniform memory arrays with a relatively wide dynamic range for analog signal input waveforms. Insofar as is presently known, transmutation p-doped substrates are not available.

The device as discussed herein should provide a solid state analog storage system with a dynamic range greater than about 40 dB. The decay rate seems to be relatively slow, decay rates of 0.1 volt or less per decade of storage time per volt of initially stored signal being relatively readily achievable. The decay rate appears to be substantially linearly dependent on the initial signal level so that an input waveform which is sampled and stored at an array of storage sites in the manner discussed above would be attenuated in time but the attenuation would not produce any significant relative distortion among the sampled signal levels stored at each site of the array.

An alternative embodiment of the invention is shown in FIGS. 7 and 8, which depict MNOS storage cells 20 utilized in conjunction with a surface acoustic wave (SAW) device, the CCD device of FIGS. 4 and 5 not being used therein. Like elements of FIGS. 4, 5, 7 and 8 use like reference numerals. As can be seen in FIGS. 7 and 8, the transfer gates 26 and CCD electrodes 29 of FIGS. 4 and 5 are not needed and the well under storage gate 25 has a charge therein which is proportioned to the sampled values of an input signal picked up by the sampling fingers 23. The charge in the storage well under storage gate 25 can thereupon be transferred to the MNOS storage cell in accordance with the operation of transfer gate 36 in substantially the same manner discussed with reference to FIGS. 6(A) through 6(N) with storage well of gate 25 operating in the same manner as CCD well 35 shown therein. Accordingly an analog replica of the input wave can be stored in MNOS cells directly from a SAW device without the need for the intermediate operation of a CCD device. As discussed above, the SAW-MNOS of FIGS. 7 and 8 can be used to provide an output signal at bus 40 by suitable transfer of charges from the MNOS storage wells to the conductive fingers 23 via transfer gate 36 and storage gate 25 to provide for an overall fast input (wide-band) and fast output (wide-band) device.

Moreover, the device of the invention can be used to provide a "triple product" correlation. In such operation, it is desired that a surface acoustic waveform signal travelling in one direction (e.g., the input signal 41 of FIG. 5), a surface acoustic waveform signal travelling in the opposite direction (e.g., an input signal 42 shown by the dashed lines in FIG. 5), and a stationary waveform (discussed below) be correlated with each other. The term stationary wave means either a wave varying in time but uniform in space, or a wave spatially varying but constant in time. In one embodiment thereof, for example, a spatially-varying, time-stationary waveform can be inserted for storage in the MNOS device or the CCD device of FIG. 5, for example, by inserting a signal serially into the CCD device at input circuit 34 and transferring the charges in the CCD wells 29 to their associated MNOS wells (if used) as discussed above. The waveform so stored represents the time-stationary waveform which can be read directly out of the CCD wells, or out of the MNOS wells (if used) into the CCD wells, and then applied to program the voltage on each finger 23 while the input waveforms are propagating through the SAW device. The non-linear interaction of all three waveforms provides the desired correlation signal. This signal can be made available in RF form at output electrode 40 in much the same manner as is achieved for SAW/CCD matched-filter operation as described in the above-mentioned copending application of Smythe, et al.

Alternately, a stationary wave which is spatially uniform but time-varying can be applied to the bus 40 of FIG. 5. The stationary wave at bus 40 and the surface acoustic wave inputs 41 and 42 interact and the interaction waveform (representing the triple-product correlation) can be temporarily stored in the CCD wells and clocked out from the CCD device at the output circuit 39 or can be stored in the long-term storage element of the MNOS device where it can be subsequently obtained at the CCD output circuit 39 (slow out) or at the bus 40 (fast out) using the techniques discussed above.

While the device of the invention is described using an MNOS device having a silicon-dioxide layer and a silicon-nitride layer, since such devices are presently available and used in other contexts by the art, the invention is not necessarily limited thereto. The invention can be adapted for use with other dual-dielectric devices which utilize two dielectric layers, one of which has non-linear current vs. field conductivity characteristics and the other of which is capable of storing carrier charges therein. In a typical MNOS device the first layer is the oxide layer and the second layer is the nitride layer, for example. The invention may be adapted to devices using more than two layers so long as at least one of the layers has non-linear current vs. field conductivity characteristics and at least one of the other layers is capable of storing carrier charges therein.

Further, it is clear that the analog output signal which is obtained can be converted by techniques available to the art to an optical signal, i.e., a signal which is in the form of a visual image, for example, as on a cathode ray tube display. Moreover, while the concept of the invention has been described with reference to an effective one-dimensional storage device, such concept can be extended to provide a two-dimensional storage array of such storage devices. The signals stored in such an array might be used to retain optical inputs which can be suitably retrieved, for example, by appropriate scanning techniques to produce a scanned output which can then be converted, as mentioned above, to a two-dimensional optical display, for example.

Moreover, while the surface acoustic wave devices in the specific embodiments described herein are formed on separate substrates, it is possible to form the SAW device as part of an overall monolithic device which uses a single substrate for the SAW device, the CCD device (if used), and the MNOS device. Thus, any suitable means for producing a surface acoustic wave with its associated electric fields and any suitable means for coupling such signal to the CCD device (if used) or to the MNOS device can be used within the spirit and scope of the invention.

Accordingly, other alternative embodiments of the invention will occur to those in the art within the spirit and scope of the invention. Hence, the invention is not to be considered as limited to the particular embodiments shown and described herein except as defined by the appended claims.

What is claimed is:

1. An analog signal storage device comprising
a plurality of first storage elements, each comprising a semiconductor substrate having at least two layers, at least one of said layers having a non-linear current vs. field conductivity characteristic and at least one other layer being capable of storing carrier charges therein;
a plurality of second storage means, each associated with one of said plurality of first storage elements;
means for applying an analog signal to said plurality of second storage means so that a charge is stored therein in each of said second storage means, the charge in each of said second storage means being proportional to the amplitude of a portion of said analog signal which is applied thereto;
storage control means for transferring the stored charges in each of said second storage means to said first storage elements so that controlled amounts of carrier charges are stored in said at least one other layer of each of said first storage elements, the controlled amounts of carrier charges stored in each said first storage element being substantially linearly proportional to the charges in said second storage means associated therewith and being stored for a time period longer than the time period of storage in said second storage means.

2. An analog signal storage device in accordance with claim 1 wherein said semiconductor substrate has first and second dielectric layers, said first dielectric layer having said non-linear current vs. field conductivity characteristics and said second dielectric layer being capable of storing carrier charges.

3. An analog signal storage device in accordance with claim 2 wherein said plurality of first storage elements are metal-nitride-oxide-silicon storage elements wherein said first dielectric layer is a silicon oxide layer and said second dielectric layer is a silicon nitride layer.

4. A device in accordance with claim 2 or 3 and further including
means for storing a pre-selected amount of carrier charges in said second dielectric layer of each of said first storage elements before said analog signal is applied to said second storage means; and
said storage control means includes
means for transferring the stored charges in each of said second storage means to its associated first storage element so as to controllably change the number of carrier charges which remain stored in said second dielectric layer of each of said first storage elements, the controlled change in the number of carrier charges which remain stored being linearly proportional to the stored charges in the associated second storage means, whereby an inverted replica of said analog signal is stored in said first storage elements.

5. A device in accordance with claim 4 and further wherein
each of said second storage means further provides means for storing a selected amount of charge therein after said analog signal has been stored in said first storage elements; and
each of said transferring means further provides means for transferring a sufficient portion of said stored selected amount of charge in said second storage means to the well of its associated first storage element to provide for equilibration of the stored selected amount of charge between each said second storage means and its associated first storage element, the charge remaining in each of said second storage means after said equilibration being proportional to the controlled amount of carrier charge which previously remained stored in said second dielectric layer of the first storage element associated therewith, whereby a replica of said analog signal is created in the second storage means without destroying the controlled charge stored in said first storage element.

6. A device in accordance with claim 5 and further including
means for converting the said charges remaining in each of said second storage means into voltage signals so as to provide a voltage replica of the analog signal stored in said first storage elements.

7. A device in accordance with claim 4 wherein said preselected amount of carrier charges stored in said second dielectric layer before said analog signal is applied is substantially the saturated amount which can be so stored.

8. A device in accordance with claim 4 wherein the preselected amount of carrier charges stored in said second dielectric layer have a first polarity and further wherein the transfer of said stored charges in said second storage means by said transferring means causes a controlled amount of carrier charges of a second polarity to tunnel to said second dielectric layer through said first dielectric layer to produce a controlled net change in the carrier charges which remain stored in said second dielectric layer.

9. A device in accordance with claims 5, 6 or 7 wherein the preselected amount of carrier charges stored in said second dielectric layer have a first polarity and further wherein the transfer of said stored charges in said second storage means by said transferring means causes a controlled amount of carrier charges of a second polarity to tunnel to said second dielectric layer through said first dielectric layer to produce a controlled net change in the carrier charges which remain stored in said second dielectric layer.

10. A device in accordance with claims 1, 2, 3, 5, 6, 7 or 8 wherein said input analog signal is an optical signal.

11. A device in accordance with claims 1, 2, 3, 5, 6, 7 or 8 wherein said input analog signal is an electrical signal.

12. A device in accordance with claim 4 wherein said input analog signal is an optical signal.

13. A device in accordance with claim 4 wherein said input analog signal is an electrical signal.

14. A device in accordance with claim 6 and further including means for converting said voltage replica to an optical image.

* * * * *